(12) United States Patent
Silveira et al.

(10) Patent No.: US 11,592,494 B1
(45) Date of Patent: Feb. 28, 2023

(54) FUZZER TEST SYSTEM FOR APPLICATIONS IN ELECTRIC POWER SYSTEMS

(71) Applicant: Schweitzer Engineering Laboratories, Inc., Pullman, WA (US)

(72) Inventors: Mauricio G. Silveira, Pullman, WA (US); Timothy D. Clemans, Moscow, ID (US); Jaya R A K Yellajosula, Houston, TX (US); Elizabeth Viele, Pullman, WA (US)

(73) Assignee: Schweitzer Engineering Laboratories, Inc., Pullman, WA (US)

( * ) Notice: Subject to any disclaimer, the term of this patent is extended or adjusted under 35 U.S.C. 154(b) by 0 days.

(21) Appl. No.: 17/585,125

(22) Filed: Jan. 26, 2022

(51) Int. Cl.
  *G01R 31/40* (2020.01)
(52) U.S. Cl.
  CPC ................... *G01R 31/40* (2013.01)
(58) Field of Classification Search
  CPC ..................................... G01R 31/40
  USPC .................... 324/764.01, 537, 500
  See application file for complete search history.

(56) References Cited

U.S. PATENT DOCUMENTS

| 10,248,522 B1* | 4/2019 | Cain ................... G06F 11/2273 |
| 10,983,901 B1* | 4/2021 | Pearce ................ G06F 11/3688 |
| 2022/0269591 A1* | 8/2022 | McShane ............. G06N 3/0472 |

OTHER PUBLICATIONS

Fred Steinhauser, Aleksandra Wiecha "Testing Methods for Assessing Relay Behaviour Under Degraded Packet Delivery in a Process Bus" Omicron Electronics, Aug. 2021, pp. 1-5.

* cited by examiner

Primary Examiner — Giovanni Astacio-Oquendo
(74) Attorney, Agent, or Firm — Jared L. Cherry

(57) ABSTRACT

The present disclosure relates to systems and methods to conduct a fuzzer test on a device under test and configured for use in an electric power system. In one embodiment, a system may include a configuration subsystem to receive a parameter of the device under test. A fuzzer subsystem in communication with the configuration subsystem may be configured to conduct a fuzzer test on the device under test. The fuzzer subsystem may include a fuzzer state machine to generate input data to deliver to the device under test, a packet buffer to store input data generated by the fuzzer state machine, and a packet regulator to deliver input data generated by the fuzzer state machine based the parameter. A physical interface in communication with the packet regulator may transmit input data to the device under test based on the parameter.

20 Claims, 4 Drawing Sheets

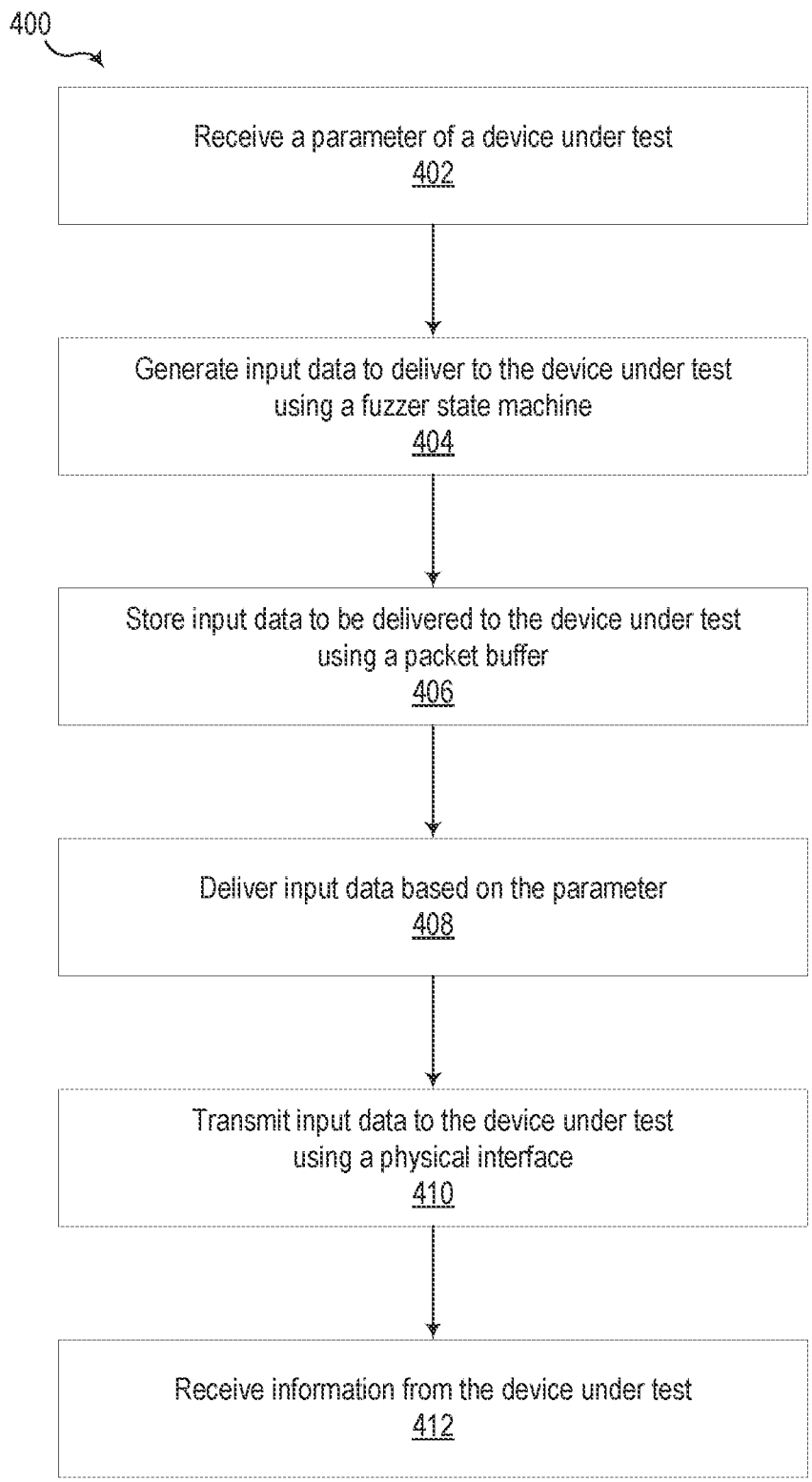

FUZZER TEST SYSTEM FOR APPLICATIONS IN ELECTRIC POWER SYSTEMS

TECHNICAL FIELD

The present disclosure pertains to test systems for applications in electric power systems. More particularly, but not exclusively, the present disclosure pertains to real-time fuzzer systems to test communication protocols and equipment in electric power systems.

BRIEF DESCRIPTION OF THE DRAWINGS

Non-limiting and non-exhaustive embodiments of the disclosure are described, including various embodiments of the disclosure with reference to the figures, in which:

FIG. 4 illustrates a flow chart of a method for using a fuzzer test system to test elements in an electric power system consistent with embodiments of the present disclosure.

DETAILED DESCRIPTION

Figure 1:
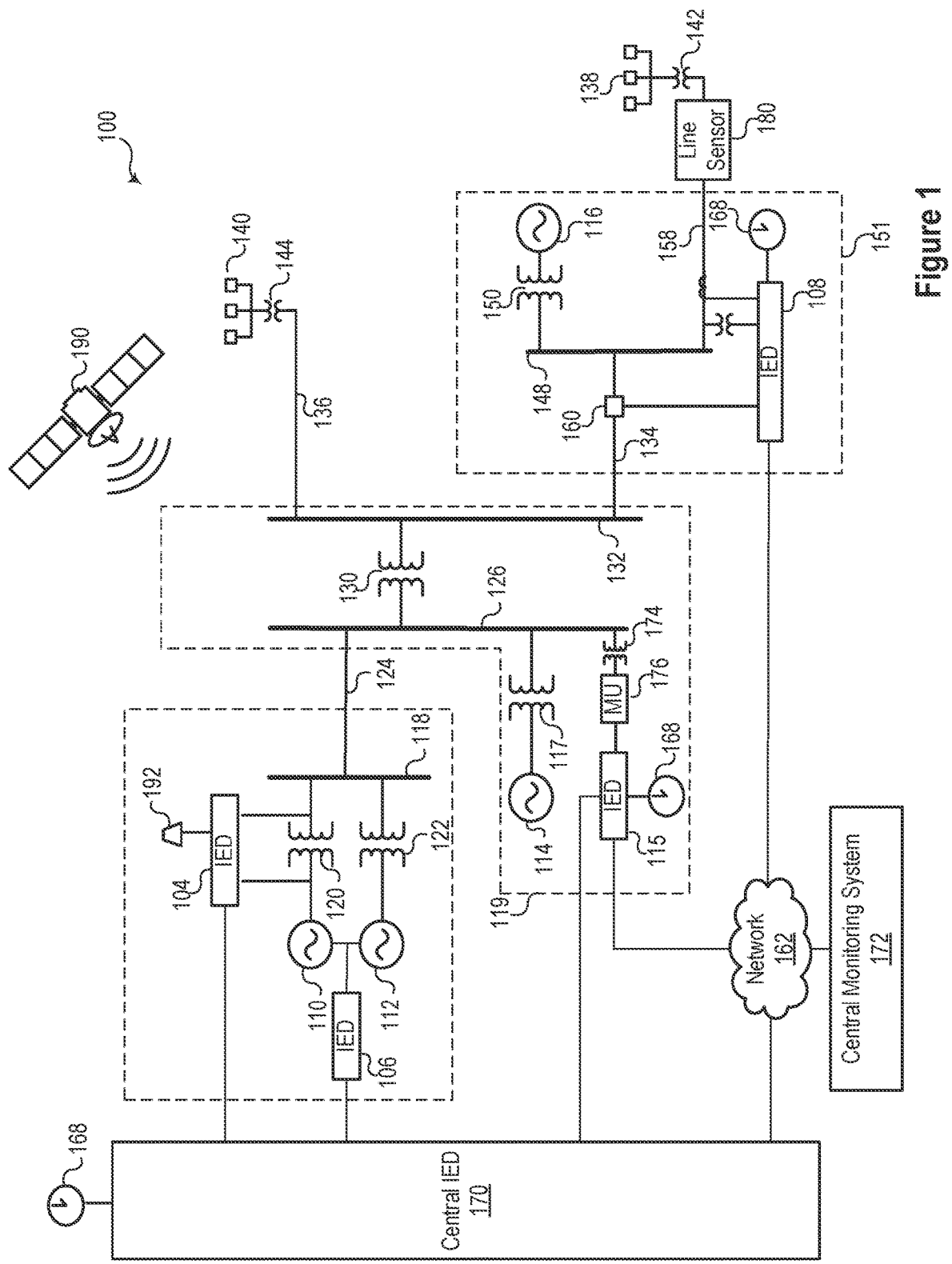
FIG. 1 illustrates a simplified one-line diagram of an electric power system consistent with embodiments of the present disclosure.

Electric power systems are used to generate, transmit, and distribute electric power to loads, and serve as an important part of critical infrastructure. Electric power systems and equipment may be monitored and protected by a variety of types of equipment. Protection relays may analyze the parameters of an electric power system to implement protective functions. The primary protective relays may communicate with various other supervisory devices such as automation systems, monitoring systems, supervisory (SCADA) systems, and other intelligent electronic devices (IEDs). IEDs may collect data from various devices within an electric power system and monitor, control, automate, and/or protect such devices.

As used herein, an IED may refer to any microprocessor-based device that monitors, controls, automates, and/or protects monitored equipment within a system. Such devices may include, for example, differential relays, distance relays, directional relays, feeder relays, overcurrent relays, voltage regulator controls, voltage relays, breaker failure relays, generator relays, motor relays, remote terminal units, automation controllers, bay controllers, meters, recloser controls, communications processors, computing platforms, programmable logic controllers (PLCs), programmable automation controllers, input and output modules, and the like. The term IED may be used to describe an individual IED or a system comprising multiple IEDs. Further, IEDs may include sensors (e.g., voltage transformers, current transformers, contact sensors, status sensors, light sensors, tension sensors, etc.) that provide information about the electric power system.

Security of electric power systems is of high concern because of the role of such systems as critical infrastructure. Elements of electric power systems may undergo rigorous testing. Such testing may help to ensure the system operates as expected in response to unexpected conditions. Electric power systems are complex, and the testing of elements within such systems is equally complex.

Fuzzer systems may provide invalid, unexpected, or random data as inputs and then monitor the response of the system. The monitoring may seek to identify exceptions such as crashes, failing built-in code assertions, or potential memory leaks. Fuzzer systems may uncover implementation issues or bugs using malformed/semi-malformed input data provided to a system under test injection. In some embodiments, the inputs may be structured to comply with an element's input requirements, while also introducing variability to probe the element's response to unexpected inputs.

Certain elements in an electric power system may operate in real-time or near real time to monitor, control, and protect the power system based on dynamic conditions. Testing of real-time or near real-time elements introduces additional complexities into an already complex task.

The inventors of the present disclosure have recognized various systems and methods disclosed herein to fuzz test real-time elements in electric power systems. Real-time or near real-time elements may adhere to stringent timing protocols. Data that is received outside of a narrow window may be discarded because real-time processing is performed on a fixed schedule. Examples of such protocols include, but are not limited to IEC 61850 Sampled Values, and the T-Protocol available from Schweitzer Engineering Laboratories of Pullman, Wash. A variety of protection systems, such as the ANSI 87L, may operate in real-time or near real-time, and thus, may be subject to stringent timing standards. Various embodiments may monitor the effects of the input generated by the fuzzer system. In some embodiments consistent with the present disclosure, a fuzzer system may be configured to regulate and deliver the fuzzer traffic as real-time data to a consuming device. Such embodiments may allow for testing of real-time devices that utilize internal timing checks on incoming data.

The embodiments of the disclosure will be best understood by reference to the drawings. It will be readily understood that the components of the disclosed embodiments, as generally described and illustrated in the figures herein, could be arranged and designed in a wide variety of different configurations. Thus, the following detailed description of the embodiments of the systems and methods of the disclosure is not intended to limit the scope of the disclosure, as claimed, but is merely representative of possible embodiments of the disclosure. In addition, the steps of a method do not necessarily need to be executed in any specific order, or even sequentially, nor do the steps need to be executed only once, unless otherwise specified.

In some cases, well-known features, structures, or operations are not shown or described in detail. Furthermore, the described features, structures, or operations may be combined in any suitable manner in one or more embodiments. It will also be readily understood that the components of the embodiments, as generally described and illustrated in the figures herein, could be arranged and designed in a wide variety of different configurations. For example, throughout this specification, any reference to "one embodiment," "an embodiment," or "the embodiment" means that a particular feature, structure, or characteristic described in connection with that embodiment is included in at least one embodiment. Thus, the quoted phrases, or variations thereof, as recited throughout this specification are not necessarily all referring to the same embodiment.

Several aspects of the embodiments disclosed herein may be implemented as software modules or components. As used herein, a software module or component may include any type of computer instruction or computer-executable code located within a memory device that is operable in conjunction with appropriate hardware to implement the programmed instructions. A software module or component may, for instance, comprise one or more physical or logical blocks of computer instructions, which may be organized as a routine, program, object, component, data structure, etc., that performs one or more tasks or implements particular abstract data types.

In certain embodiments, a particular software module or component may comprise disparate instructions stored in different locations of a memory device, which together implement the described functionality of the module. A module or component may comprise a single instruction or many instructions and may be distributed over several different code segments, among different programs, and across several memory devices. Some embodiments may be practiced in a distributed computing environment where tasks are performed by a remote processing device linked through a communications network. In a distributed computing environment, software modules or components may be located in local and/or remote memory storage devices. In addition, data being tied or rendered together in a database record may be resident in the same memory device, or across several memory devices, and may be linked together in fields of a record in a database across a network.

Embodiments may be provided as a computer program product including a non-transitory machine-readable medium having stored thereon instructions that may be used to program a computer or other electronic device to perform processes described herein. The non-transitory machine-readable medium may include, but is not limited to, hard drives, floppy diskettes, optical disks, CD-ROMs, DVD-ROMs, ROMs, RAMs, EPROMs, EEPROMs, magnetic or optical cards, solid-state memory devices, or other types of media/machine-readable media suitable for storing electronic instructions. In some embodiments, the computer or another electronic device may include a processing device such as a microprocessor, microcontroller, logic circuitry, or the like. The processing device may further include one or more special-purpose processing devices such as an application-specific interface circuit (ASIC), PAL, PLA, PLD, field-programmable gate array (FPGA), or any other customizable or programmable device.

FIG. 1 illustrates a simplified one-line diagram of an electric power system 100 consistent with embodiments of the present disclosure. Electric power system 100 may be configured to generate, transmit, and distribute electric energy to loads. Electric power systems may include equipment such as electrical generators (e.g., generators 110, 112, 114, and 116), transformers (e.g., transformers 117, 120, 122, 130, 142, 144, 150, and 174), power transmission and delivery lines (e.g., lines 124, 134, 136, and 158), circuit breakers (e.g., breaker 160), busses (e.g., busses 118, 126, 132, and 148), loads (e.g., loads 138 and 140) and the like. A variety of other types of equipment may also be included in electric power system 100, such as voltage regulators, capacitor banks, and the like.

Substation 119 may include a generator 114, which may be a distributed generator, and which may be connected to bus 126 through step-up transformer 117. Bus 126 may be connected to a distribution bus 132 via a step-down transformer 130. Distribution lines 136 and 134 may be connected to distribution bus 132. Load 140 may be fed from distribution line 136. Further, step-down transformer 144 in communication with distribution bus 132 via distribution line 136 may be used to step down a voltage for consumption by load 140.

Distribution line 134 may lead to substation 151 and deliver electric power to bus 148. Bus 148 may also receive electric power from distributed generator 116 via transformer 150. Distribution line 158 may deliver electric power from bus 148 to load 138 and may include further step-down transformer 142. Circuit breaker 160 may be used to selectively connect bus 148 to distribution line 134. IED 108 may be used to monitor and/or control circuit breaker 160 as well as distribution line 158.

Electric power system 100 may be monitored, controlled, automated, and/or protected using IEDs, such as IEDs 104, 106, 108, 115, and 170, and a central monitoring system 172. In general, IEDs in an electric power generation and transmission system may be used for protection, control, automation, and/or monitoring of equipment in the system. For example, IEDs may be used to monitor equipment of many types, including electric transmission lines, electric distribution lines, current transformers, busses, switches, circuit breakers, reclosers, transformers, autotransformers, tap changers, voltage regulators, capacitor banks, generators, motors, pumps, compressors, valves, and a variety of other types of monitored equipment.

Central monitoring system 172 may comprise one or more of a variety of types of systems. For example, central monitoring system 172 may include a supervisory control and data acquisition (SCADA) system and/or a wide area control and situational awareness (WACSA) system. A central IED 170 may be in communication with IEDs 104, 106, 108, and 115. IEDs 104, 106, 108, and 115 may be remote from the central IED 170 and may communicate over various media such as a direct communication from IED 106 or over a wide-area communications network 162. According to various embodiments, certain IEDs may be in direct communication with other IEDs (e.g., IED 104 is in direct communication with central IED 170) or may be in communication via a communication network 162 (e.g., IED 108 is in communication with central IED 170 via communication network 162).

A common time signal 168 may be used to time-align measurements for comparison and/or synchronize action across electric power system 100. Utilizing a common or universal time source may allow for the generation of time-synchronized data, such as synchrophasors. In various embodiments, the common time source may comprise a time signal from a GNSS system 190. IED 104 may include a receiver 192 configured to receive the time signal 168 from the GNSS system 190. In various embodiments, IED 106 may be configured to distribute the time signal 168 to other components in electric power system 100, such as IEDs 104, 108, 115, and 170.

A voltage transformer 174 may be in communication with a merging unit (MU) 176. MU 176 may provide information from voltage transformer 174 to IED 115 in a format useable by IED 115. MU 176 may be placed near to voltage transformer 174 and may digitize discrete input/output (I/O) signals and analog data, such as voltage measurements. These data may then be streamed to IED 115. In various embodiments, MU 176 may be located outside of a substation enclosure or control house, thus increasing safety by removing high-energy cables from areas where personnel typically work. In various embodiments, MU 176 may be embodied as an SEL-2240 available from Schweitzer Engineering Laboratories of Pullman, Wash.

A variety of sensors, such as line sensor 180, may be distributed throughout electric power system 100 to provide information regarding electrical conditions used for automation, monitoring, and protection. Line sensor 180 may track the frequency of alternating current through transmission line 158 to determine a data sampling period and obtain a specified number of samples per cycle. The sampled data may be provided to IED 108 or another device for use in a variety of applications, such as determining a fault current magnitude, determining a fault direction, and detecting a high impedance fault, etc.

System 100 may include elements that operate in real-time or near real-time and that provide monitoring, protection, and/or automation. Such real-time systems may allow system 100 to address changing conditions (e.g. increased load demands) while maintaining the stability of the system. Real-time or near real-time systems may receive data (e.g., current measurements) from elements in system 100 and process such information according to a strict schedule. Due to the time-sensitivity of real time systems, input data is subject to stringent timing requirements that can be difficult to satisfy in a test setup. For example, if a test system fails to provide a data frame within a narrow time window, the system under test may simply drop the data frame. This may make testing difficult because it may be unclear whether all of the test data was processed. If all of the test data was not processed (e.g., because the test data was included in a frame that was dropped), the test does not provide information about how the system would respond to such data.

Figure 2:
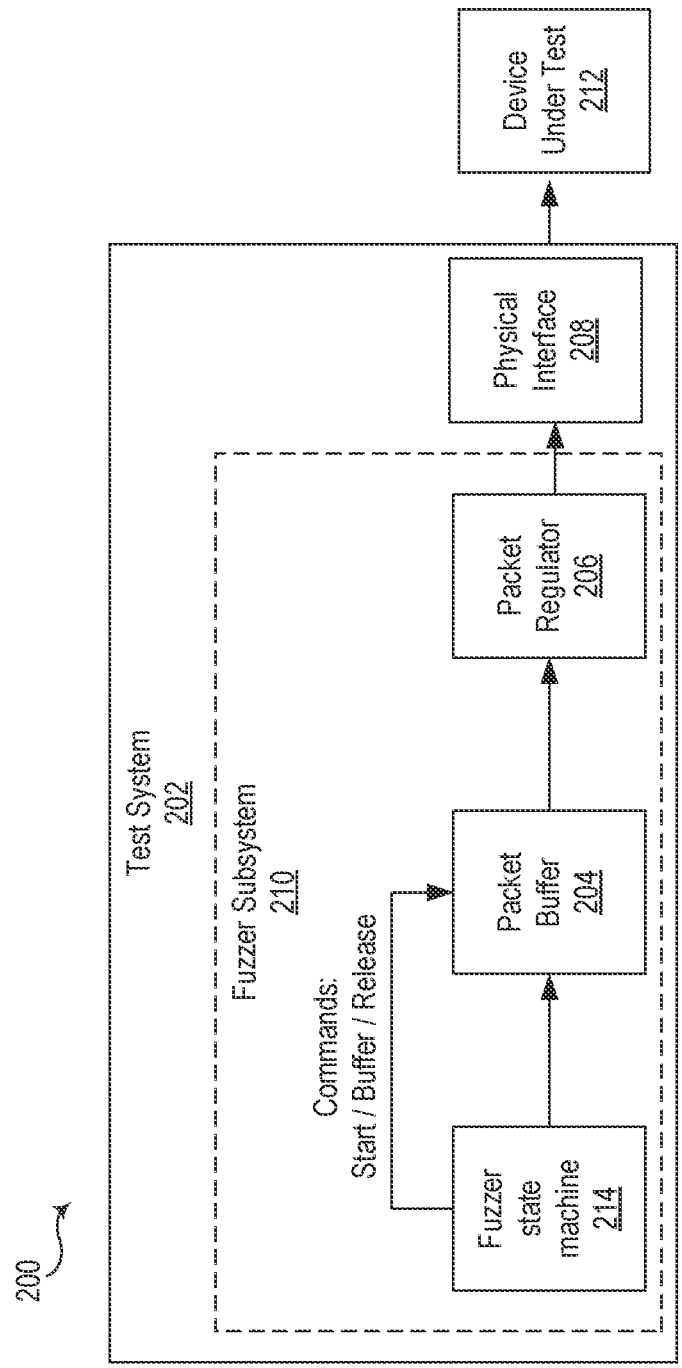
FIG. 2 illustrates a block diagram of a test system configured to complete a fuzzer test and a device under test consistent with embodiments of the present disclosure.

FIG. 2 illustrates a block diagram of system 200 including a test system 202 and a device under test 212 consistent with embodiments of the present disclosure. The test system 202 may include a fuzzer state machine 214 configured to generate inputs for the device under test 212. The fuzzer state machine 214 may comprise settings about the format of the input data used by the device under test 212 and may generate input data to be transmitted to the device under test 212. In some embodiments, the fuzzer state machine 214 may comprise software configured to generate malformed/semi-malformed input data. In some embodiments, the fuzzer state machine 202 may comprise commercially available software.

A packet buffer 204 may be configured to receive and store inputs generated by the fuzzer state machine 214. The packet buffer 204 may store the inputs generated by the fuzzer state machine 214 until fuzzer test system 202 is ready to execute a test. In some embodiments, the fuzzer state machine 214 may generate the input data more slowly than the device under test 212 consumes the input data. Accordingly, fuzzer state machine 214 may generate a data set that is stored in packet buffer 204 until a sufficient amount of input data is available to conduct a test. The fuzzer state machine 214 may control operation of the packet buffer 204 by issuing a plurality of commands to packet buffer 204. Such commands may include: a start command to cause packet buffer 204 to begin receiving data, a buffer command to begin storing data, and a release command to begin releasing data to a packet regulator 206.

The packet regulator 206 may be configured to implement a timing requirement for the device under test 212. As discussed above, certain real-time or near real-time systems may have stringent timing requirements that must be satisfied or the data is discarded. For example, a real-time or near real-time system may have a window of approximately 100 microseconds in which to receive data, and data that is received late may be discarded. Specific time parameters may be established based on the specifications of a device under test 212.

The fuzzer state machine 214, the packet buffer 204, and packet regulator 206, may be a part of a fuzzer subsystem 210. The elements of fuzzer subsystem 210 may operate to conduct a fuzzer test on a variety of types of devices used in electric power systems, and in particular, for real-time or near real time systems.

A physical interface 208 may connect the fuzzer test system 202 to the device under test 212. A variety of types of physical interfaces may be utilized in various embodiments For example, the physical interface 208 may comprise an Ethernet port, a Universal Serial Bus (USB) port, an IEEE 1394 port, or other type of interface.

Figure 3:
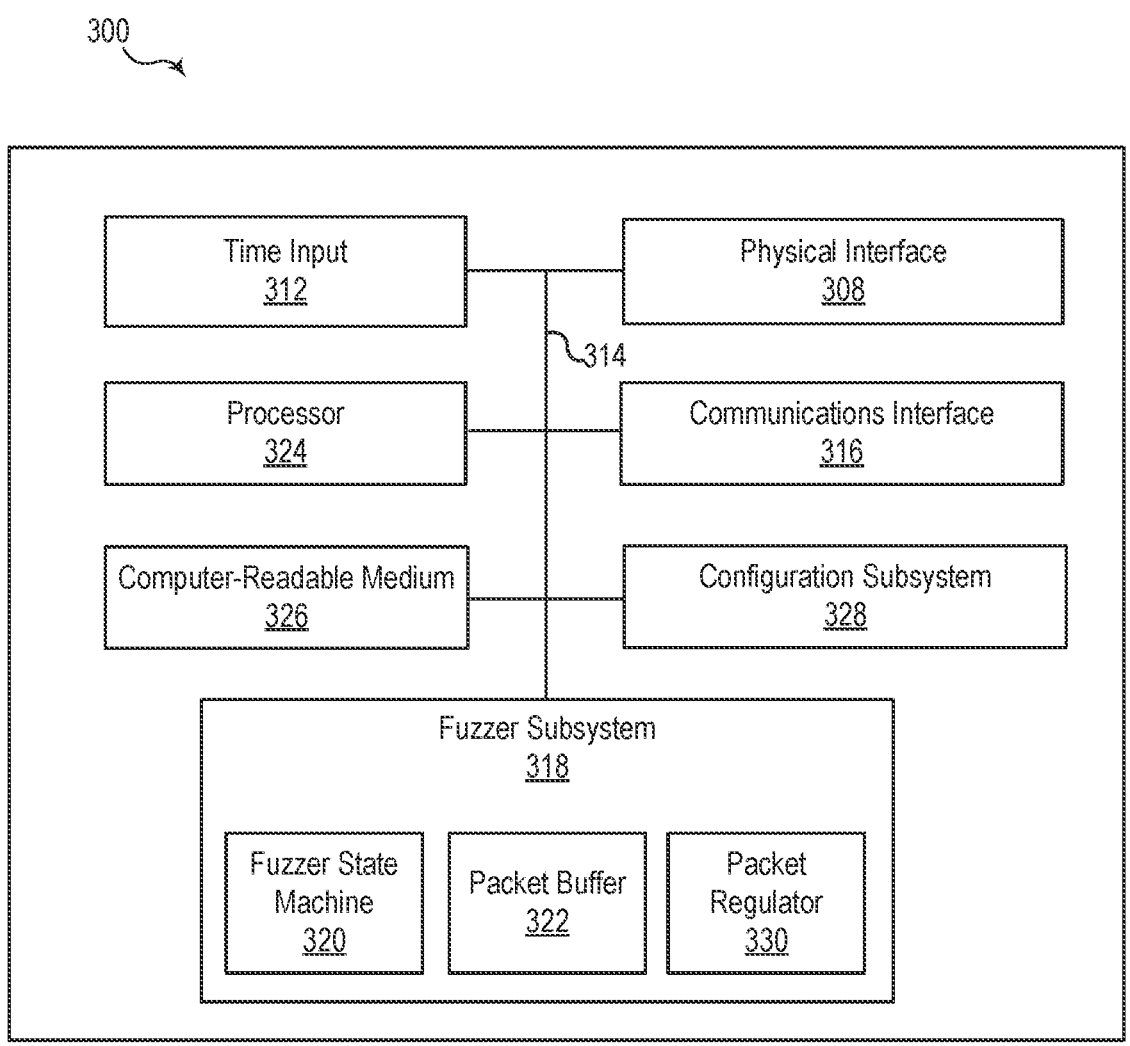
FIG. 3 illustrates a functional block diagram of a system to test elements in an electric power system consistent with embodiments of the present disclosure.

FIG. 3 illustrates a functional block diagram of a system 300 to test elements in an electric power system consistent with embodiments of the present disclosure. System 300 may be implemented using hardware, software, firmware, and/or any combination thereof. In some embodiments, system 300 may be embodied as an IED, a protective relay, or other type of device. Certain components or functions described herein may be associated with other devices or performed by other devices. The specifically illustrated configuration is merely representative of one embodiment consistent with the present disclosure.

System 300 includes a communications interface 316 to communicate with relays, IEDs, and/or other devices. In certain embodiments, the communications interface 316 may facilitate direct communication or communicate with systems over a communications network (not shown). System 300 may further include a time input 312, which may be used to receive a time signal (e.g., a common time reference) allowing system 300 to coordinate actions with a device under test (not shown) or another system. In certain embodiments, a common time reference may be received via communications interface 316, and accordingly, a separate time input may not be required for time-stamping and/or synchronization operations. One such embodiment may employ the IEEE 1588 protocol.

A physical interface 308 may provide information, receive information, or issue control instructions to a device under test. In some embodiments, the device under test may be configured to interact with system 300 in the same manner as the device would interact with another device (e.g., an IED) in an electric power system. The system 300 may provide malformed/semi-malformed input data as part of a fuzzer test using the physical interface 308, and the system 300 may receive input from the device under test using the physical interface 308. The device under test may generate information (e.g., commands to execute a protective action) in response to the input provided by system 300. In some embodiments, communications interface 316 may also provide a physical interface to connect to the device under test, and in such embodiments, a separate physical interface is unnecessary.

Processor 324 processes communications received via communications interface 316, time input 312, and/or monitored equipment interface 308. Processor 324 may operate using any number of processing rates and architectures. Processor 324 may perform various algorithms and calculations described herein. Processor 324 may be embodied as a general-purpose integrated circuit, an application-specific integrated circuit, a field-programmable gate array, and/or any other suitable programmable logic device. A data bus 314 may provide connection between various components of system 300.

Instructions to be executed by processor 324 may be stored in computer-readable medium 326. Computer-readable medium 326 may comprise random access memory (RAM) and non-transitory storage. Computer-readable medium 326 may be the repository of software modules configured to implement the functionality described herein.

A configuration subsystem 328 may allow an operator to configure various aspects of system 300, including the specific criteria associated with the device under test. For example, an operator may specify a window for delivery of data to a real-time or near real-time system. Further, an operator may specify criteria used to synchronize the delivery of data to the system under test.

A fuzzer subsystem 318 may be configured to conduct a fuzzer test. Fuzzer system 318 may include specific functional units or modules associated with conducting a fuzzer test. In the illustrated embodiment, the fuzzer subsystem 318 includes a fuzzer state machine 320 that generates the test input provided to a device under test. A packet buffer 322 may store data generated by the fuzzer state machine 320 until a test is in process. The buffered data may be consumed by the device under test at a rate that exceeds the rate at which such data is generated by the fuzzer state machine 320. As such, buffering the input data may allow system 300 to pre-generate the input for the test. A packet regulator 330 may be configured to deliver data based on the parameters (e.g., time windows, synchronization criteria, etc.) specified using the configuration subsystem 328.

FIG. 4 illustrates a flow chart of a method 400 for using a fuzzer test system to test elements in an electric power system consistent with embodiments of the present disclosure. At 402, a parameter of a device under test may be received. The parameter may be based on the specifications of a device under test. In some embodiments, particularly embodiments used for testing of real-time or near real-time elements, the parameter may comprise timing information for delivery of input information. A user may provide the parameter using a configuration subsystem.

At 404, input data to deliver to the device under test may be generated using a fuzzer state machine. The fuzzer state machine may be comprised by a fuzzer subsystem. Input data may be structured to comply with input requirements of an element under test, but may introduce variability to probe the element's response to unexpected inputs. Input data may comprise a wide variety of malformed or semi-malformed inputs that may be delivered to a device under test.

At 406, input data to be delivered to the device under test may be stored using a packet buffer. The packet buffer may be implemented using a computer-readable medium, such as computer-readable medium 326 illustrated in FIG. 3. The packet buffer may be sized to allow a suitable amount of input data to be stored and used based on the parameter. In some instances, the device under test may consume input data at a faster rate than the fuzzer state machine generates input data. Accordingly, the fuzzer state machine may generate input data prior to initiation of the fuzzer test, and such input data may be stored in the packet buffer until a sufficient amount of input data is available to conduct the test. In some embodiments, input data may also be generated during a fuzzer test.

At 408, input data may be delivered based on the parameter. Delivery of input data may be performed by a packet regulator, such as packet regulator 330 illustrated in FIG. 3. The packet regulator may deliver the data based on the parameter and/or other requirements of the device under test.

At 410, the input data may be transmitted to the device under test using a physical interface. The physical interface may be embodied using a variety of types of physical media. For example, the physical interface may comprise an Ethernet port, a Universal Serial Bus (USB) port, an IEEE 1394 port, or other type of interface.

At 412, information from the device under test may be received. The information may allow for identification of exceptions, such as crashes, failing built-in code assertions, or potential memory leaks. Information received from the device under test may be analyzed to determine whether the input data resulted in anomalous behavior by the device under test.

While specific embodiments and applications of the disclosure have been illustrated and described, it is to be understood that the disclosure is not limited to the precise configurations and components disclosed herein. Accordingly, many changes may be made to the details of the above-described embodiments without departing from the underlying principles of this disclosure. The scope of the present invention should, therefore, be determined only by the following claims.

What is claimed is:

1. A system to conduct a fuzzer test on a device under test and configured for use in an electric power system, the system comprising:
   a configuration subsystem to receive a parameter of the device under test;
   a fuzzer subsystem in communication with the configuration subsystem and configured to conduct the fuzzer test on the device under test, the fuzzer subsystem comprising:
      a fuzzer state machine to generate input data to deliver to the device under test;
      a packet buffer to store input data generated by the fuzzer state machine; and
      a packet regulator to deliver input data generated by the fuzzer state machine based the parameter; and
   a physical interface in communication with the packet regulator and configured to transmit input data to the device under test based on the parameter.

2. The system of claim 1, wherein the parameter comprises a configurable time window for delivery of data to the device under test.

3. The system of claim 2, wherein the time window comprises about 100 microseconds.

4. The system of claim 1, wherein the system is configured to test a real-time device.

5. The system of claim 1, wherein the fuzzer state machine is further configured to generate input data prior to initiation of the fuzzer test and during the fuzzer test.

6. The system of claim 5, wherein the device under test consumes input data at a faster rate than the fuzzer state machine generates input data.

7. The system of claim 1, wherein the fuzzer state machine issues a plurality of commands to control operation of the packet buffer.

8. The system of claim 7, wherein the plurality of commands comprise buffering input data and releasing input data.

9. The system of claim 1, wherein the physical interface receives information from the device under test.

10. The system of claim 9, wherein the information comprises an exception caused by the fuzzer test.

11. A method for conducting a fuzzer test on a device under test and configured for use in an electric power system, the method comprising:
    receiving, using a configuration subsystem, a parameter of the device under test;

providing a fuzzer subsystem in communication with the configuration subsystem and configured to conduct the fuzzer test on the device under test generating, using a fuzzer state machine associated with the fuzzer subsystem, input data to deliver to the device under test;

storing, using a packet buffer associated with the fuzzer subsystem, input data generated by the fuzzer state machine;

delivering, using a packet regulator associated with the fuzzer state machine, input data generated by the fuzzer state machine based the parameter; and transmitting, using a physical interface in communication with the packet regulator, input data to the device under test based on the parameter.

12. The method of claim 11, wherein the parameter comprises a time window for delivery of data to the device under test.

13. The method of claim 12, wherein the time window comprises about 100 microseconds.

14. The method of claim 11, wherein the device under test comprises a real-time device.

15. The method of claim 11, wherein the fuzzer state machine generates input data prior to initiation of the fuzzer test and during the fuzzer test.

16. The method of claim 15, wherein the device under test consumes input data at a faster rate than the fuzzer state machine generates input data.

17. The method of claim 11, further comprising issuing, using the fuzzer state machine, a plurality of commands to control operation of the packet buffer.

18. The method of claim 17, wherein the plurality of commands comprise buffering input data and releasing input data.

19. The method of claim 11, further comprising receiving, using the physical interface, information from the device under test.

20. The method of claim 19, wherein the information comprises an exception caused by the fuzzer test.

\* \* \* \* \*